(12) United States Patent
Arabi et al.

(10) Patent No.: US 6,223,314 B1
(45) Date of Patent: *Apr. 24, 2001

(54) METHOD OF DYNAMIC ON-CHIP DIGITAL INTEGRATED CIRCUIT TESTING

(76) Inventors: Karim Arabi, Écol de Technologie Supérieur, 1100, rue Notre-Dame Ouest, Montreal (Quebec) (CA), H3C 1K3; Bozena Kaminska, 8209 SW. Cirrus Dr., Beaverton, OR (US) 97006

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/001,713

(22) Filed: Dec. 31, 1997

(51) Int. Cl.[7] .................................................. G01R 31/28
(52) U.S. Cl. ............................................................ 714/726
(58) Field of Search .................................... 714/726, 727, 714/728, 729, 733

(56) References Cited

U.S. PATENT DOCUMENTS

| | | | |
|---|---|---|---|
| 5,553,082 | * | 9/1996 | Conner et al. ........................ 714/726 |
| 5,617,426 | * | 4/1997 | Koenemann et al. ................ 714/726 |
| 5,774,476 | * | 6/1998 | Pressly et al. ........................ 714/726 |
| 5,811,655 | * | 9/1998 | Hashimoto et al. .................. 73/1.42 |
| 5,867,033 | * | 2/1999 | Sporck et al. ........................ 324/763 |

* cited by examiner

*Primary Examiner*—Albert Decady
*Assistant Examiner*—Guy Lamarre
(74) *Attorney, Agent, or Firm*—Ipsolon LLP

(57) ABSTRACT

A method and associated circuitry test propagation delay through a path in digital circuits and integrated circuits. The method first sensitizes the target path in the circuit. Then depending on the path a feedback is established between the output and the input of the path to construct an inverting loop. If the path is inverting, the feedback will be noninverting and if the path is noninverting, the feedback will be inverting. The inverting loop or ring carries oscillation signals. In one implementation, the feedback element is connected using a multiplexer coupled to the circuit under test. As the oscillation frequency is determined by the propagation delay through the path, it can be used to measure the path propagation delay. Any kind of faults that can stop the oscillations, such as stuck at faults in the loop, can be detected by observing the oscillation frequency.

15 Claims, 6 Drawing Sheets

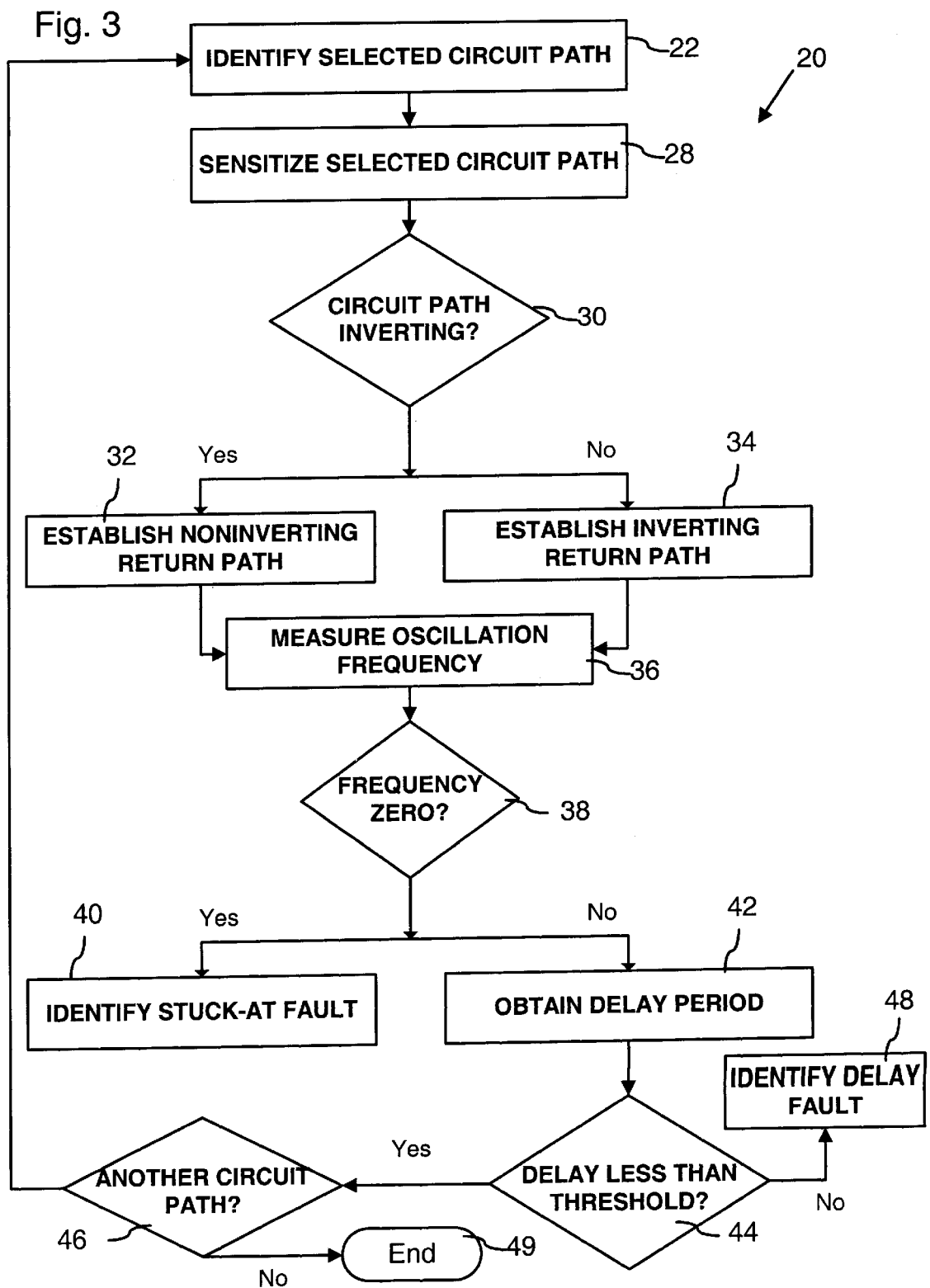

METHOD OF DYNAMIC ON-CHIP DIGITAL INTEGRATED CIRCUIT TESTING

BACKGROUND OF THE INVENTION

This invention deals with testing of path delay and stuck-at faults in sensitized paths of digital circuits and digital integrated circuits.

DESCRIPTION OF THE RELATED ART

Testing of digital systems has primarily been to detect steady state malfunctions in logic. This is done using a standard fault model, the "stuck-at 0 or 1" fault, which successfully describes most of the steady-state malfunctions in logic circuits. However, as the structure of logic circuits has become more complex, system timing failures are occurring more frequently. Because the system must operate at higher speeds with greater circuit complexity, the resolution of timing failures is critical to reliable and economical performance.

Timing-related failures may be caused by isolated gate delays or by process-related timing problems that accumulate along logic paths and prevent the circuit from functioning at-speed. The delay faults are becoming critical in deep submicron (DSM) technologies where the interconnect delays exceed the gate delays. Interconnect delay varies as a function of place and route efficiency and process variations and is not predictable at gate level chip simulation. The adoption of DSM technology mandates the use of additional test methods to detect timing-related failures.

In an attempt to identify timing related defects, functional vectors are sometimes applied at-speed on the tester to identify timing-related defects. Although it may improve test quality, this practice suffers from two potential problems. The first problem is the availability of test equipment capable of operating at-speed on modern high speed digital circuits. This kind of test equipment will be very expensive, if not impossible, to construct. Also, input and output pads limit the speed of external functional test vectors. The second problem is that functional vectors applied at-speed may omit critical paths from being tested if the pattern set is not complete and exhaustive.

Timing-related malfunctions are characterized by the concept of delay faults related to circuit critical paths. Conventional techniques for delay test require two distinct primary input vectors that provoke a transition signal at the fault site and propagate the faulty delay effect to a primary output. In the literature, timing related defects have been broadly modeled as gate delay faults or as path delay faults. The gate delay fault model assumes that the incorrect timing behavior of the circuit is due to excess delays in one or more components in the path. Test vector generators based on the gate delay fault model deal with one fault at a time and try to find a test which sensitizes some path through the fault location such that the transition at the output is affected by the target fault. The path delay fault model considers whether the propagation delay through one or more paths exceeds the timing constraint. Therefore, this model makes no assumption about the individual component delays. To be reliable, at least all critical paths in the system should be tested.

In a combinational circuit the path that has the longest propagation time from a primary input to a primary output, called the critical path, determines the operating speed of the circuit. Other paths may have much shorter propagation times and therefore a parametric variation in their delay value may not affect the circuit operating speed unless the changes make their propagation time longer than the critical path delay. However, even a very small increase in the critical path delay will slow down the operating speed of the circuit.

Also in a sequential circuit, the system is free of timing failures if every combinatorial path between two memory elements propagates its signal in less time than the interval of the operating system clock. In other words, the input signal of every memory element in the system should have a stable signal before the arrival of the active clock edge. A simplified example of a sequential circuit is shown in FIG. 1. To make sure that the system is fault-free, the clock period $T_{CK}$ should be greater than the sum of the propagation delay of the individual components FFi ($t(PD)_{FFi}$), the propagation delay of the combination circuit ($t(PD)_{CC}$), and the set-up time of the initial component FFo ($t(SU)_{FFo}$).

$$T_{CK} \geq t(PD)_{FFi} + t(PD)_{CC} + t(SU)_{FFo} \qquad (1)$$

The above relationship can be rewritten as follows $$T_{CK} - t(PD)_{FFi} - t(SU)_{FFo} \geq t(PD)_{CC} \qquad (2)$$

Therefore a given delay increase in a path may result in a malfunction in the circuit, but the same delay increase in another path may not affect the circuit functionality and performance. If the only test target is the propagation delay regardless of the circuit functionality, a delay fault on a path that does not affect the circuit performance will result in the rejection of a circuit that is functionally acceptable. This may lead to a large number of false rejections of acceptable circuits resulting a significant yield loss.

BRIEF SUMMARY OF THE INVENTION

A method and associated circuitry test propagation delay through a path in digital circuits and integrated circuits. The method first sensitizes the target path in the circuit. Then depending on the path a feedback is established between the output and the input of the path to construct an inverting loop. If the path is inverting, the feedback will be noninverting and if the path is noninverting, the feedback will be inverting.

The inverting loop or ring carries oscillation signals. In one implementation, the feedback element is connected using a multiplexer coupled to the circuit under test. As the oscillation frequency is determined by the propagation delay through the path, it can be used to measure the path propagation delay. Any kind of faults that can stop the oscillations, such as stuck at faults in the loop, can be detected by observing the oscillation frequency.

Additional objects and advantages of the present invention will be apparent from the detailed description of the preferred embodiment thereof, which proceeds with reference to the accompanying drawings.

BRIEF DESCRIPTION OF DRAWINGS

FIG. 3 is a flow diagram of an oscillation test method.

DETAILED DESCRIPTION OF THE INVENTION

Figure 2:
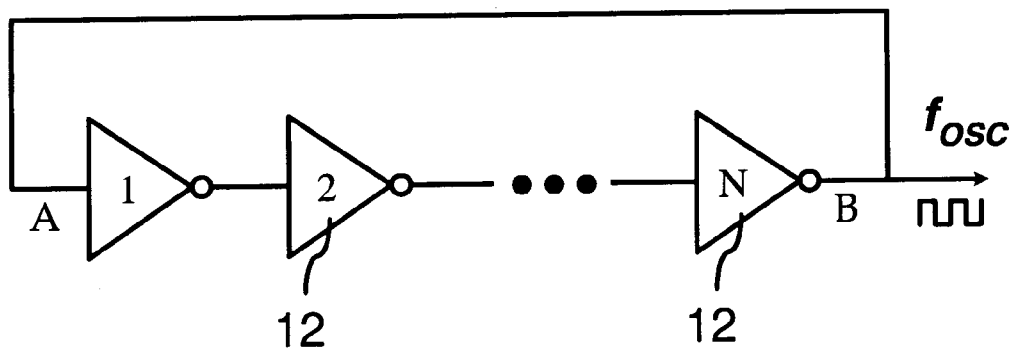
FIG. 2 is a ring oscillator constructed with an odd number of inverters.

FIG. 2 shows a prior art digital ring oscillator 10. Oscillations occur when there is an odd number of inverters 12 in the ring 10. The oscillation frequency given by the equation (3) is determined by the sum of 0 to 1 and 1 to 0 propagation delays in the loop. Therefore, the propagation delay from node A to node B can be obtained by measuring the oscillation frequency. Any fault that affects the propagation delay from node A to node B affects the oscillation frequency. Also, any stuck-at 0 or 1 fault in the circuit will stop the oscillations and therefore can be detected by observing the oscillation frequency. If the circuit under test was a chain of inverters from point A to B, the circuit could be tested for all stuck-at and path delay faults by simply connecting nodes A and B and observing the oscillation frequency.

$$f_{osc} = \frac{1}{\sum_{i=1}^{N} (t_{PD_{LH}} + t_{PD_{LH}})|_i} \quad (3)$$

The test methodology is called a digital oscillation-test and includes sensitizing a path in the digital circuit under test and then incorporating the circuit in a ring oscillator to test for delay and stuck-at faults. This procedure should be exercised for all or at least critical paths in the circuit. If the path is inverting, we establish a non-inverting feedback from its output to its input to convert it to an oscillator. For a non-inverting path, an inverting feedback should be established by connecting its output to its input via an inverter. In other words, we should make sure that there is an odd number of inverters in the loop to establish oscillations. To sensitize a path in the circuit, off-path inputs of all gates directly involved in the path should be set to non-controlling values by properly setting the primary inputs.

FIG. 3 is a flow diagram of a digital oscillation test method 20 for testing path delay and stuck-at faults in digital integrated circuits. Test method 20 is described as being applied to a digital integrated circuit, but method 20 is similarly applicable to automated test modeling as performed by digital modeling software.

Figure 4:
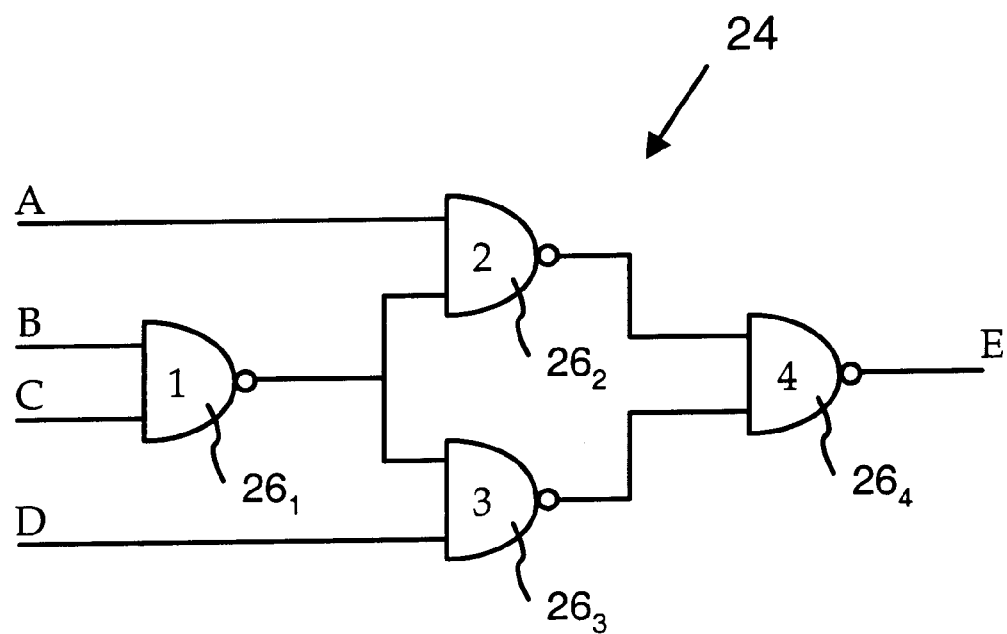
FIG. 4 is a simple combinational circuit used to introduce the proposed test technique.
Figure 5:
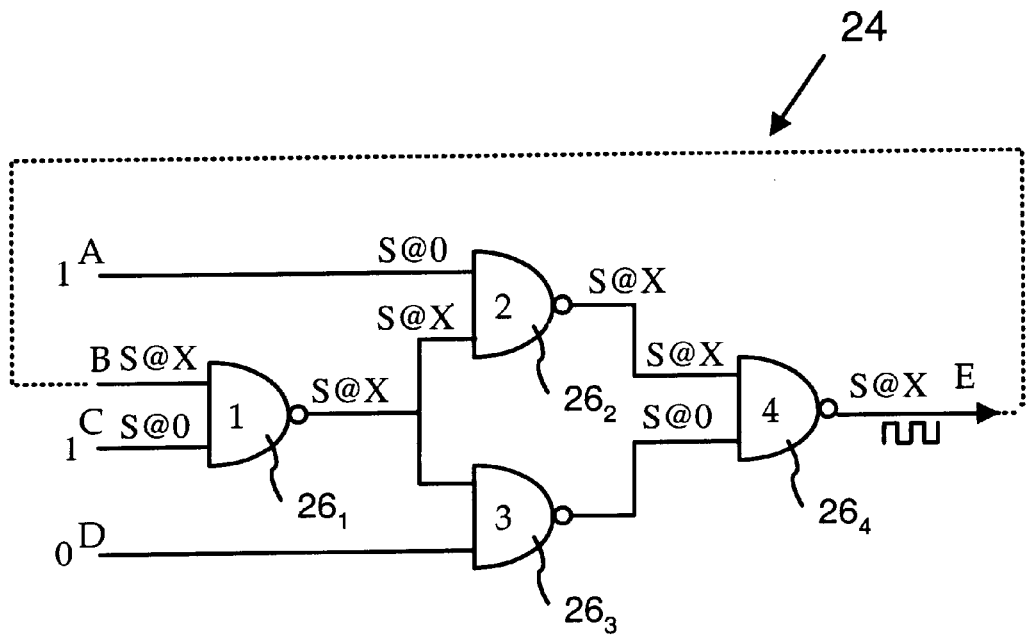
FIG. 5 is the schematic of FIG. 4 with the path B-G1-G2-G4-E sensitized and converted to an oscillator with a noninverting feedback.

Process block 22 indicates that a selected logic path through a digital circuit under test is identified. FIG. 4 is a diagram of an exemplary combinational digital circuit 24, which is of a simple form for purposes of illustration. Test circuit 24 includes gates $26_1$, $26_2$, $26_3$, and $26_4$ and interconnections between them. FIG. 5 illustrates a selected logic path B-G1-G2-G4-E through digital circuit 24 and having an input node (e.g., node B) and an output node (e.g., node E) and passing through gates $26_1$, $26_2$, and $26_4$.

Process block 28 indicates that the selected logic path (e.g., logic path B-G1-G2-G4-E) is sensitized. For example, off-path inputs of gates directly involved in the path are set to non-controlling values by setting appropriate input nodes (e.g., nodes A, C, or D of circuit 24) accordingly. FIG. 5 illustrates sensitization of the selected logic path B-G1-G2-G4-E (represented by the settings S@X) with input nodes A and C set to logic 0 states (represented as S@0).

Query block 30 represents an inquiry as to whether the selected logic path is inverting. Whenever the selected logic path is inverting, query block 30 proceeds to process block 32. Whenever the selected logic path is noninverting, query block 30 proceeds to process block 34.

Process block 32 indicates that a noninverting return path is established from the output node (e.g., node E to the input node (e.g., node B). The noninverting return path may be a simple-line or buffer return.

Process block 34 indicates that an inverting return path is established from the output node (e.g., node E to the input node (e.g., node B). Process blocks 32 and 34 cooperate with query block 30 to provide establish a closed path or ring that includes the selected logic path and an odd-number of inverters or inversions, thereby to form a ring oscillator test circuit. The selected logic path may be connected manually or with a test circuit apparatus as described below in greater detail. As is known in the art, establishment of the closed path or ring with an odd-number of inverters or inversions initiates signal oscillations through the path.

Process block 36 indicates that the oscillation frequency fosc of the signal oscillations through the closed path are measured. Measurement of the oscillation frequency includes identifying a frequency of zero corresponding to a stuck at 0 or 1 fault that would interrupt the signal oscillations.

Query block 38 represents an inquiry as to whether the oscillation frequency is zero. Whenever the oscillation frequency is zero, query block 38 proceeds to process block 40. Whenever the oscillation frequency is not zero, query block 38 proceeds to process block 42.

Process block 40 indicates that a stuck-at fault s identified.

Process block 42 indicates that an inverse of the oscillation frequency is obtained to determine the delay period of the selected logic path.

Query block 44 represents an inquiry as to whether the delay period is less than a predetermined test threshold such as the clock period of the digital system in which the selected logic path is to be used. In some applications, the delay period of the logic path is compatible with a digital system if the delay period is less than the clock period of the digital system. In other applications, a test threshold period other than the clock period could be used. Query block 44 proceeds to query block 46 whenever the delay period is less than the predetermined test threshold. Query block 44 proceeds to process block 48 whenever the delay period is greater than the predetermined test threshold.

Query block 46 represents an inquiry as to whether the digital circuit under test (e.g., circuit 24) includes another logic path to be tested. Query block 46 returns to process block 22 whenever the digital circuit under test includes another logic path to be tested. Query block 46 proceeds to termination block 49.

Process block 48 indicates that a delay fault is identified for the selected logic path.

FIG. 5 illustrates the case where the path from node B to node E through gates 1, 2 and 4 is sensitized and converted to an oscillator by connecting node E to node B. By measuring the oscillation frequency, the sensitized path delay fault can be measured and gate 1, 2 and 4 delay faults can be tested as well. In addition stuck-at 0 and 1 (X) faults of all nodes that are directly involved in the path can be detected as they stop the oscillations. Some stuck-at faults related to nodes that sensitize the path such as stuck-at 0 at nodes A and C can also be detected.

Figure 6:
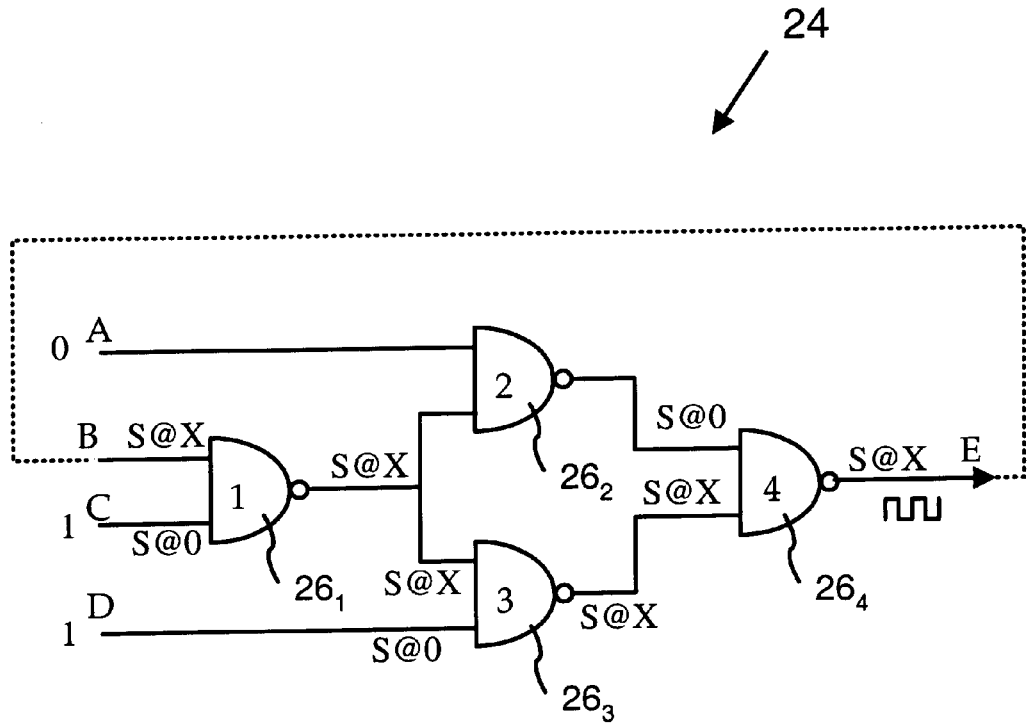
FIG. 6 is the schematic of FIG. 4 with the path B-G1-G3-G4-E sensitized and converted to an oscillator with a non-inverting feedback.
Figure 7:
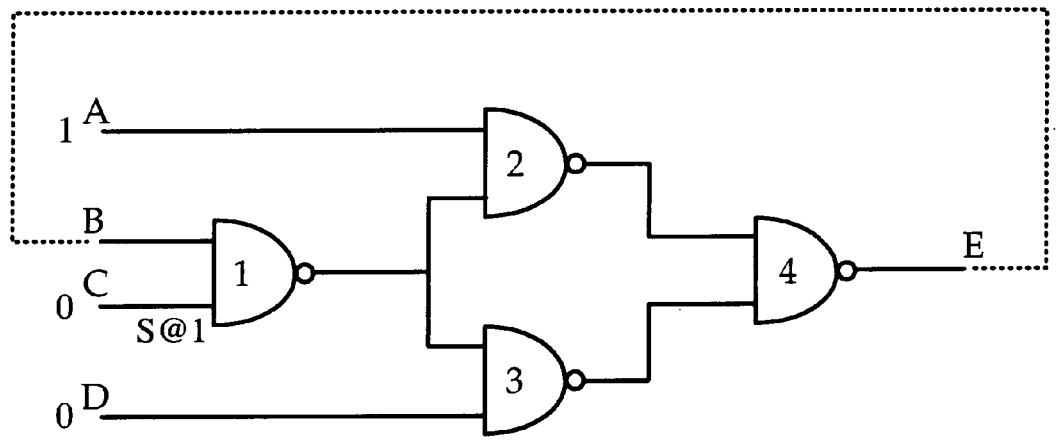
FIG. 7 is the schematic of FIG. 4 with a non-inverting feedback between output E and input B and an input pattern to detect S @ 1 fault at input C.
Figure 8:
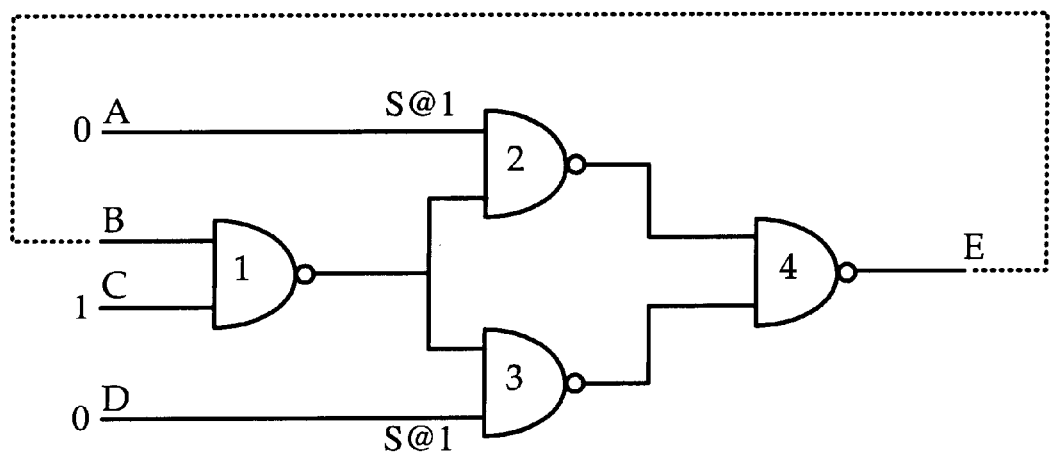
FIG. 8 is the schematic of FIG. 4 with a non-inverting feedback between output E and input B and an input pattern to detect S @ 1 fault at inputs A and D.

In practical applications, many paths may exist between a given primary input and primary output. In FIG. 6 the primary inputs have been changed to sensitize the path between the nodes B and E through the gates 1, 3 and 4. As a result another path delay in the circuit can be measured and some additional stuck-at faults can be covered. The only stuck-at faults that are not yet tested are stuck-at 1 at primary inputs A, C and D. The input test vectors in FIGS. 7 and 8 activate these faults. These test vectors should stop the oscillations unless there are stuck-at 1 faults in nodes A, C and D. Therefore, by connecting the node E to node B and applying only four input test vectors, two critical path delays in the circuit are measured and all stuck-at faults are detected.

Figure 9:
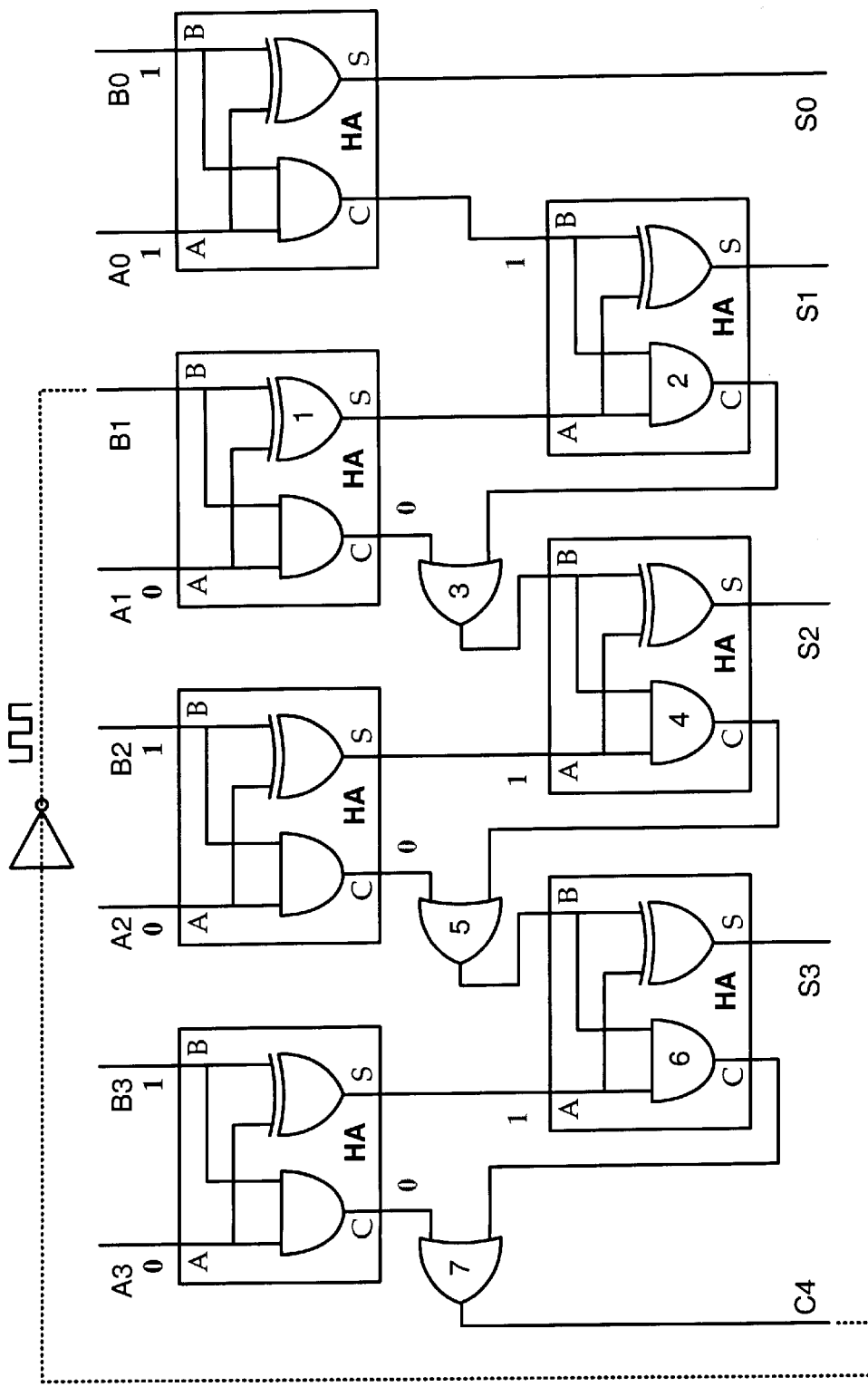
FIG. 9 is a detailed schematic diagram of a 4-bit digital adder with its critical path sensitized and converted to an oscillator using an inverting feedback.

FIG. 9 illustrates application of digital oscillation-test method 20 to a 4-bit digital adder 50 for path and gate delay testing. As shown in FIG. 9 the critical path that determines the operation speed of the circuit is the path between the input B1 and the output C4 through gates 1, 2, 3, 4, 5, 6 and 7. The input test vector $A_{3-0}$ (0001) and $B_{3-0}$ (11-1) sensitizes this critical path. The sensitized path is noninverting and therefore to establish an oscillator the output C4 should be connected to the input B1 through an additional inverter.

In another implementation, the oscillation-test method was applied to an 8-bit digital adder to measure its critical path delay. The circuit along with its associated test circuitry were implemented using a XC7372 EPLD of Xilinx Corporation which is a high performance reprogrammable complex PLD. Several samples of the adder have been implemented using different kinds of macrocells and different place and route techniques in the same device to construct adders with different speed performances. The oscillation-test method was able to precisely measure the critical path delay and therefore determine the maximum operating frequency of each sample.

Figure 10:
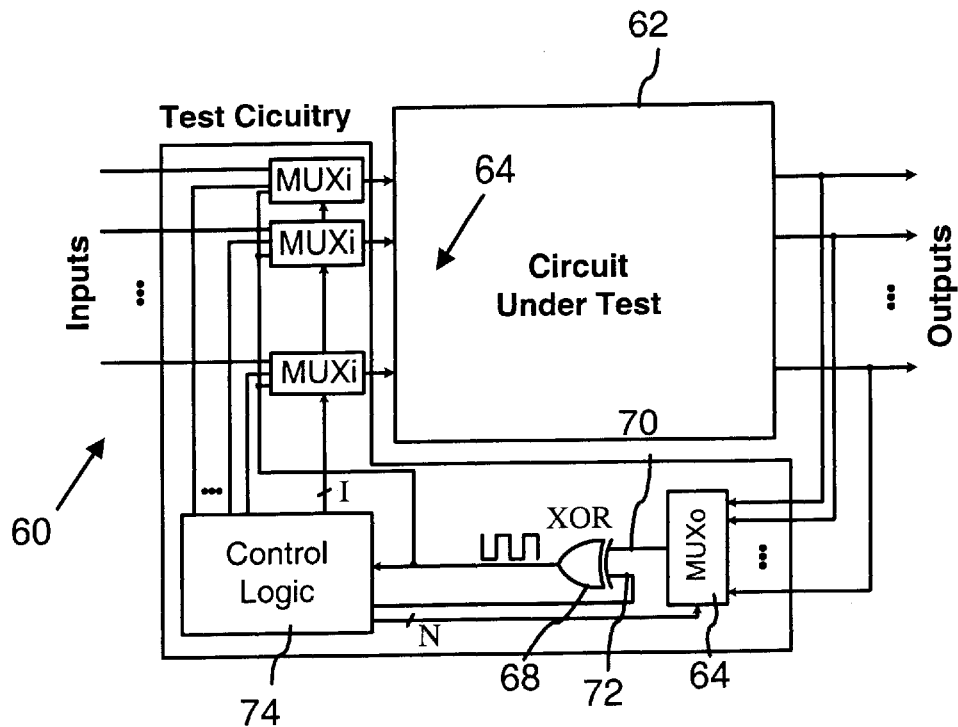
FIG. 10 is a block diagram representation of a typical implementation of the proposed method for a circuit under test.
Figure 1:
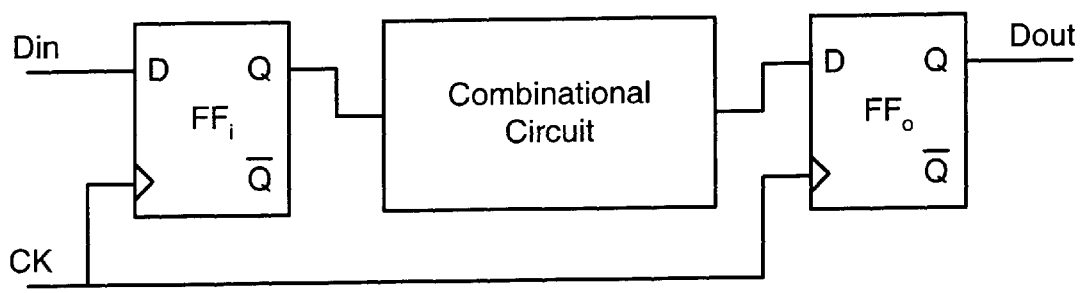
FIG. 1 is a simplified representation of a sequential circuit.

FIG. 10 represents a block diagram of an oscillation test system 60 that provides oscillation testing of a circuit 62 under test. Multiplexer 64 (MUXo) is used to select the output and establish the feedback loop. Multiplexers 66 (MUXi) disconnect the inputs from their supplying circuitry and apply a pattern to sensitize the target path or connect an output to an input to construct a closed loop or ring. Exclusive-OR device 68 (XOR) establishes either an inverting or non-inverting feedback loop. XOR device 68 includes an on-path input 70 and an off-path input 72. With off-path input 72 set to 1 to act as a non-inverting buffer between its on-path input and its output and with its off-path input set to 0 to act as an inverter between its on-path input and its output. Control logic 74 controls multiplexers 64 and 66 (MUXi and MUXo), generates the required input pattern, and measures or observes the oscillation frequency, as described with reference to test method 20 above.

The above test method describes the manner in which an integrated circuit can be tested for path delay faults as well as stuck-at faults. It can be used as a fully on-chip technique or in conjunction with an off-the-shelf integrated circuit tester. The particular type of tester or the specific technique to sensitize the path and convert it to an oscillator may change as engineering choices. The examples treated in this invention are only to describe the main disclosed technique and the proposed test method is not limited in its application to those examples. Various changes can be made without departing from the spirit and scope of the invention as defined by the following claims.

What is claimed is:

1. A method of testing both propagation delays and stuck-at faults in a functional digital circuit that performs a function in addition to testing propagation delays and stuck-at faults, the functional digital circuit having a selected circuit path with an input and an output, the method comprising connecting between the output and the input of the selected circuit path a feedback element to establish an inverting loop for testing both propagation delays and stuck-at faults in the functional digital circuit.

2. The method of claim 1 in which the functional digital circuit further includes plural gates that have gate inputs and correspond to one or more other circuit paths, the method further comprising sensitizing the selected circuit path of the functional digital circuit by setting non-controlling input values at the gate inputs of gates directly involved in the path, which gate inputs are not in the selected circuit path, for testing both propagation delays and stuck-at faults in the functional digital circuit.

3. The method of the claim 1 in which the feedback element is inverting if the selected circuit path is non-inverting.

4. The method of the claim 1 in which the feedback element is non-inverting if the selected circuit path is inverting.

5. The method of claim 1 in which the feedback element includes an XOR gate with an off-path input and an on-path input and in which the off-path input is set to 1 if the selected circuit path is inverting and is set to 0 if the selected circuit path is non-inverting.

6. The method of claim 1 in which the inverting loop carries through the functional digital circuit an oscillation signal with an oscillation frequency, and the method further comprises measuring the propagation delay time through the selected circuit path by measuring the oscillation frequency.

7. The method of claim 1 in which the functional digital circuit includes one or more circuit nodes and in which the method further comprises detecting stuck-at faults at nodes associated with the selected circuit path by observing the absence of an oscillation signal in the inverting loop.

8. A method of testing both propagation delays and stuck-at faults in a functional digital circuit that performs a function in addition to testing propagation delays and stuck-at faults, the functional digital circuit having a selected circuit path with an input and an output, the method comprising connecting between the output and the input of the selected circuit path a feedback element to establish an inverting loop for carrying through the functional digital circuit an oscillation signal with an oscillation frequency, the propagation delays corresponding to the oscillation frequency and a stuck-at fault corresponding to absence of an oscillation signal.

9. The method of claim 8 in which the digital circuit further includes plural gates that have gate inputs and correspond to one or more other circuit paths, the method further comprising sensitizing the selected circuit path of the functional digital circuit by setting non-controlling input values at the gate inputs of gates directly involved in the path, which gate inputs are not in the selected circuit path.

10. The method of the claim 8 in which the feedback element is inverting if the selected circuit path is non-inverting.

11. The method of the claim 8 in which the feedback element is non-inverting if the selected circuit path is inverting.

12. The method of claim 8 in which the feedback element includes an XOR gate with an off-path input and an on-path input and in which the off-path input is set to 1 if the selected circuit path is inverting and is set to 0 if the selected circuit path is non-inverting.

13. A digital semiconductor integrated test circuit for testing both propagation delays and stuck-at faults in a functional digital circuit that performs a function in addition to testing propagation delays and stuck-at faults, comprising:

multiplexer means for connecting a selected output and a selected input of a selected path in the functional digital circuit; and inverted loop feedback means feedback between the selected output and the selected input of the functional digital circuit to form an inverting loop over the selected path, wherein the inverting loop carries an oscillation signal with an oscillation frequency, the oscillation frequency corresponding to propagation delays in the functional circuit and stuck-at faults corresponding to an absence of the oscillation signal.

14. The circuit of claim 13 in which the inverted loop feedback means includes an exclusive or gate to provide feedback between the selected output and the selected input and to form the inverting loop.

15. The circuit of claim 13 further comprising and an exclusive or gate to provide feedback between the selected output and the selected input to form an inverting loop.

* * * * *